US008735203B2

(12) United States Patent
Enebakk et al.

(10) Patent No.: US 8,735,203 B2
(45) Date of Patent: May 27, 2014

(54) SOLAR CELLS

(75) Inventors: Eric Enebakk, Kristiansand (NO); Kristian Peter, Constance (DE); Bernd Raabe, Constance (DE); Ragnar Tronstad, Sogne (NO)

(73) Assignee: Elkem Solar AS, Oslo (NO)

( * ) Notice: Subject to any disclaimer, the term of this patent is extended or adjusted under 35 U.S.C. 154(b) by 821 days.

(21) Appl. No.: 12/517,502

(22) PCT Filed: Nov. 28, 2007

(86) PCT No.: PCT/NO2007/000422
§ 371 (c)(1),
(2), (4) Date: Oct. 7, 2009

(87) PCT Pub. No.: WO2008/069675
PCT Pub. Date: Jun. 12, 2008

(65) Prior Publication Data
US 2010/0212738 A1 Aug. 26, 2010

(30) Foreign Application Priority Data

Dec. 4, 2006 (NO) .................................. 20065586

(51) Int. Cl.
*H01L 21/225* (2006.01)
(52) U.S. Cl.
USPC ............................ 438/58; 136/258; 136/251
(58) Field of Classification Search
USPC ...................................... 438/58, 97; 136/258
See application file for complete search history.

(56) References Cited

U.S. PATENT DOCUMENTS

| 4,416,051 A | * | 11/1983 | Thomas et al. ................. 438/58 |
| 5,627,081 A | | 5/1997 | Tsuo et al. |
| 2005/0268963 A1 | * | 12/2005 | Jordan et al. ................... 136/256 |

FOREIGN PATENT DOCUMENTS

| DK | 170189 | | 12/1991 |
| JP | 2004119867 | | 4/2004 |
| WO | 02103810 | | 12/2002 |
| WO | WO 2005-063621 | * | 7/2005 |

OTHER PUBLICATIONS

Narasimha et al., The Optimization and Fabrication of High Efficiency HEM Multicrystalline Silicon Solar Cells, 25th IEEE Photovoltaics Specialists Conference, May 13-17, 1996, Washington, DC.*
Cuevas et al., High Minority Carrier Lifetime in Phosphorus-Gettered Multicrystalline Silicon, Applied Physics Letters, vol. 70 (8), pp. 1017-1019, Feb. 1997.*
Hartiti B; Slaoui A; Muller J C; Slifert P; Schindler R; Reis I; Wagner B; Eyer A "Multicrystalline silicon solar cells processed by rapid thermal processing" Proceedings of the Photovoltaic Specialists Conference, Louisville, p. 224-229, May 10-14, 1993; Institute of Electrical and Electronics Engineers; p. 224-225.
Alnajjar A A, "Influence of annealing conditions on the efficiency of phosphorous gettering in CZ-Si for solar cell applications", Renewable Energy, p. 445-452, vol. 20, NR 4, PD Aug. 1, 2000; p. 446-451.
Narasimha S; Kamra S; Rohatgi A; Khattak C P; Ruby D, "The optimization and fabrication of high efficiency HEM multicrystalline silicon solar cells" p. 449-452, Photovoltaic Specialists Conference, 1996., Conference Record of the Twenty Fifth IEEE, Publication Date: May 13-17, 1996; p. 449-450.
W. Jooss, M. Spiegel, P. Fath, E. Bucher, S. Roberts, T.M. Bruton, University of Konstanz, Department of Physics, Large Area Buried Contact Solar Cells on Multicrystalline Silicon With Mechanical Surface Texturisation and Bulk Passivation (four pages).
Andres Cuevas, Matthew Stocks, Stephane Armand, Michael Stuckings, and Andrew Blakers, Department of Engineering, F.E.I.T., Australian National Univeristy, Canbera, ACT 0200, Australia; Francesca Ferrazza, Eurosolare, V. D'Andrea 6, 00048, Nettuno, Italy, "High minority carrier lifetime in phosphorus-gettered multicrystalline silicon", pp. 1017-1019.
S. Martinuzzi, F. Ferrazza and I. Perichaud, UMR TECSEN, Universite Paul Cezanne-Aix Marseille III, Faculte des Sciences at Technique—13397 Marseille cedex 20, France, Improved P-Type or Raw N-Type Multicrystalline Silicon Wafers for Solar Cells, pp. 525-530.

\* cited by examiner

*Primary Examiner* — Jayne Mershon
(74) *Attorney, Agent, or Firm* — Lucas & Mercanti, LLP

(57) ABSTRACT

The present invention relates to multicrystalline p-type silicon wafers with high lifetime. The silicon wafers contain 0.2-2.8 ppma boron and 0.06-2.8 ppma phosphorous and/or arsenic and have been subjected to phosphorous diffusion and phosphorous gettering at a temperature of above 925° C. The invention further relates to a method for production of such multicrystalline silicon wafers and to solar cells comprising such silicon wafers.

8 Claims, No Drawings

SOLAR CELLS

This application is a 371 of PCT/NO2007/000422 filed Nov. 28 2007, which in turn claims the priority of NO 20065586 filed Dec. 4 2006, the priority of both applications is hereby claimed and both applications are incorporated by reference herein.

BACKGROUND ART

In production of solar cells based on conventional multicrystalline silicon, the silicon wafers are subjected to a number of heatment steps before being made into final solar cells. One of these heat treatment steps is a diffusion/gettering process comprising a diffusion process where an applied phosphorous source is forced a few micrometers into the surface of the wafer by diffusion in order to create a pn-junction in the surface of the wafer. The source of phosphorous can be gaseous $POCl_3$ or $P_2C_5$ dissolved in an organic solvent with addition of for instance $SiO_2$. After vaporation of possible solvents the diffusion of phosphorous into the surface of the wafer is done by heat treatment. The diffusion process is relatively fast and can typically take place at 900° C. in the course of a few minutes. The temperature and the time is chosen in accordance to the electrical properties one wants to achieve in the surface of the water. Thereafter the phosphorous gettering takes place where unwanted dissolved and mobile metallic impurity elements are transported to and captured by the phosphorous layer that has been diffused into the surface of the wafer. This process is typically carried out at 600-850° C. in the course of 1 to 2 hours. This bulk passivation is known as phosphorous gettering or P-gettering.

The lifetime of the minority carriers in a wafer is defined as the time it takes from an electron and a hole is generated from the sunlight intill they are recombined. The lifetime is usually measured in microseconds. If the lifetime for the minority carriers is to short in order that they can move to the pn-junction for the wafer, they will not contribute to production of electric current in the solar cell. The lifetime is reduced among other things by dissolved metal impurities such as Fe, Zn, Ni and Cu in the wafer. It is therefore important for the capability of the solar cell to produce electric current that the amount of dissolved metal impurities can be reduced. It is believed that for instance Fe in conventional multicrystalline silicon wafers is present both as dissolved Fe and as $FeSi_2$-phases. $FeSi_2$-phases will during heat treatment dissolve and increase the content of dissolved Fe in the wafer and cause a reduced lifetime. The gettering process will remove a part of the dissolved iron and other metal impurities, but if the gettering rate for dissolved Fe is lower than the rate by which $FeSi_2$ is dissolved, the netto concentration of dissolved iron will increase and the lifetime of the solar cells will be reduced.

When diffusion/phosphorous gettering at high temperatures (>900° C.) are performed on conventional multicrystalline wafer it has been found that this usually results in a reduction of lifetime for the minority carriers in the wafer and thus is an increased production cost. For this reason conventional multicrystalline solar cells are today produced by the use of moderate temperatures in the range of 600 to 850° C. in order to prevent that the amount of dissolved metals does not become too high. In conventional multicrystalline wafers it is therefore normally not possible to take advantage of high temperature diffusion and phosphorous gettering at for instance 950° C.

In the paper by W. Jooss et. al., "Large Area Buried Contact Solar Cells and Multicrystalline Silicon with Mechanical Surface Texturation and Bulk Passivating", Proceedings of the 16th European Photovoltaic Solar Energy Conference, 1-5 May 2000, page 1169-1172, it is disclosed that solar cells with buried contacts can be made from conventional multicrystalline silicon wafers where phosphorous gettering is carried out at a temperature up to 950° C. Of the two types of multicrystalline wafers used, identified as wafers from Eurosolare and Bayer, it is stated that problems occurred during processing of wafers from Eurosolare. The highest bulk diffusion lengths which were obtained according to the paper by Jooss were $L_a$=180 µm for wafers from Bayer and $L_a$=195 µm for wafers from Eurosolare. This corresponds to lifetimes of respectively 27 µs and 36 µs which is relatively low and lower than normal lifetimes for conventional multicrystalline wafers where phosphorous gettering has been carried out using conventional temperatures between 600 and 850° C. It is therefore reason to believe that high temperature phosphorous gettering of these conventional multicrystalline wafers does not result in an increased lifetime for the wafers. Even it in the paper by Jooss et. al. is described that solar cells made from conventional multicrystalline wafers can be manufactured with buried contacts, it is not obtained wafers with increased lifetime compared to conventional multicrystalline wafers where phosphorous gettering has been done at low temperatures. This is also confirmed by the cell efficiencies for the solar cells that are stated in the paper. Efficiencies of 15,9% and 15,6% and higher are normally also achieved for solar cells manufactured from conventional multicrystalline wafers where phosphorous gettering has been carried out at a temperature between 600 and 850° C. and where the solar cells consequently do not have buried contacts.

One of the steps in the manufacturing of solar cells with buried contacts comprises high temperature diffusion in the areas where the buried contacts shall be made. Phosphorous is applied in grooves in the wafer and are diffused into the surface at a typical temperature of 950° C. in a time period of 30 minutes. By buried contacts it is understood electrical contacts buried in grooves in the wafer. This has the big advantage that the part of the surface area of the wafer which is available for energy production is increased compared to wafers where the contacts are situated on the wafer surface.

Monocrystalline wafers are of higher purity than multicrystalline wafers and the lack of grain boundaries results in the above mentioned heat treatment steps does not affect monocrystalline wafers to the same extent than conventional multicrystalline wafers. This makes it possible to use new and more effective solar cells concepts such as for instance making buried contacts, which require heat treatment steps at higher temperatures than what is typical for multicrystalline wafers. Monocrystalline wafers are, however, substantially more costly than multicrystalline wafers.

Conventional multicrystalline wafers are made from electronic grad silicon (EG-Si) and silicon rejects from the electronic industry. This quality of silicon has a very high purity, particularly when it comes to phosphorous and boron. Phosphorous and boron content in this quality of silicon are in practice negligible. When wafers are produced from this material it is first produced an ingot by directional solidification whereafter the ingot is sliced into wafers. During the ingot production the silicon is doped with boron or phosphorous in order to produce p-type material or n-type material. When doping with one of the two doping agents it is assumed that the content of the other is negligible. With a few exceptions multicrystalline solar cells are today made from boron doped material.

In the latest years it has been developed so-called compensated multicrystalline silicon for solar cells. This is silicon which contain both phosphorous and boron and which normally has a higher content of other impurity elements, particularly iron than electronic grade silicon. Compensated multicrystalline silicon is produced by refining, cleaning and directional solidification of metallurgical silicon such as described in WO 2005/063621. Wafers made from compensated multicrystalline silicon thus contain both boron and phosphorous and optionally arsenic and other elements like iron distributed in the bulk material, mainly concentrated in the grain boundaries. Wafers manufactured from compensated multicrystalline silicon based on metallurgical silicon by phosphorous gettering at the same temperatures that are used for phosphorous gettering of conventional multicrystalline wafers have reasonable lifetimes, but normally the lifetime is somewhat lower than the lifetime for wafers produced from conventional multicrystalline wafers.

It is therefore a need for silicon wafers made from compensated multicrystalline silicon with increased lifetime and where solar cells with buried contacts can be made from this material.

DESCRIPTION OF THE INVENTION

The present invention relates to multicrystalline p-type silicon wafers having a high lifetime, which silicon wafers contain 0.2-2.8 ppma boron and 0.06-2.8 ppma phosphorous and/or 0.6-2.8 ppma arsenic and have been subjected to phosphorous diffusion and phosphorous gettering at a temperature of more than 925° C.

According to a preferred embodiment the silicon wafers have been subjected to phosphorous diffusion and phosphorous gettering at a temperature of at least 950° C.

According to another preferred embodiment the multicrystalline silicon wafers contain 0.3-0.75 ppma boron and 0.1-0.75 ppma phosphorous. For best results it is preferred that the ratio between ppma phosphorous and ppma boron is between 0.2 and 1.

The present invention further relates to a method for phosphorous diffusion and phosphorous gettering of p-type multicrystalline wafers at high temperatures, which method in characterized in that p-type multicrystalline silicon wafers containing 0.2-2.8 ppma boron, 0.06-2.8 ppma phosphorous and/or 0.06-2.8 ppma arsenic are subjected to phosphorous diffusion and phosphorous gettering at a temperature of more than 925° C.

According to a preferred embodiment the silicon wafers are subjected to phosphorous diffusion and phosphorous gettering at a temperature of at least 950° C.

Preferably the multicrystalline wafers contain 0.3-0.75 ppma boron and 0.1 to 0.75 ppma phosphorous. According to a particularly preferred embodiment the ratio between ppma phosphorous and ppma boron between 0.2 and 1.

Finally the present invention relates to solar panels comprising p-type multicrystalline silicon wafers with high lifetime which silicon wafers contain 0.2-2.8 ppma boron and 0.06-2.8 ppma phosphorous and/or arsenic and have been subjected to phosphorous diffusion and phosphorous gettering at a temperature of more than 925° C.

The solar cell panels are preferably made from silicon wafers which have been subjected to phosphorous diffusion and phosphorous gettering at a temperature of at least 950° C.

It has surprisingly been found that high temperature diffusion and gettering carried out at temperature above 925° C. of wafers that contain both boron and phosphorous and/or arsenic in the above amounts results in a substantially increased lifetime of the wafers. Lifetimes of 100-200 µs have thus been obtained. It has also been found that the edge effect for the silicon wafers according to the invention is eliminated or strongly reduced. In addition the method of the present invention where the phosphorous gettering is carried out at a temperature of above 925° C. makes it possible to manufacture multicrystalline wafers with buried contacts at the same time as the lifetime of the wafers is increased. The invention further makes it possible to carry out the phosphorous diffusion and phosphorous gettering processes in a substantially shorter time at the increased temperatures on compensated multicrystalline wafers without reducing the quality. This increase in production rate results in an substantial reduction of costs for production of solar cells.

The reason why one observes this surprising increase of lifetime due to high temperature treatment of silicon wafers containing boron, phosphorous and/or arsenic is not fully understood, but it is believed that one of the reasons is that iron and other metallic elements in these silicon wafers to a lower extent are present as easily dissolvable $FeSi_2$ or other easily dissolvable intermetallic phases such as is the case in conventional multicrystalline silicon wafers which only contains boron. It is believed that Fe in silicon wafers which contains boron and phosphorous and/or arsenic mostly are in the form of Fe—P phases and/or Fe—As phases and other metal-P phases or metal-As phases which are more stable at higher temperatures than $FeSi_2$ and other metal-silicate phases. During phosphorous and phosphorous gettering even at very high temperatures iron and other metallic elements that are present as metal-P phases or metal-As phases, will not or to a low extent dissolve resulting in that netto content of dissolved metallic elements will quickly be removed during the phosphorous gettering process.

EXAMPLE 1

Prior art

High temperature processing of conventional commercial p-type boron doped multicrystalline wafer containing $1-5 \times 10^{14}$ Fe atoms per $cm^3$.

Phosphorous was by $POCl_3$-diffusion forced in the surface of a commercial p-type wafer until the chee. Resistance was 100 ohm $cm^2$. An anti-reflection coating was applied to the front side of the wafer by silicon nitride CVD deposition. Grooves for buried contact were made in the surface of the wafer and phosphorous was by $POCl_3$-diffusion forced into the grooves at a temperature of 950° C. for some minutes. After the diffusion process the sheet resistance was 10 ohm $cm^2$. A back contact of Al was alloyed into the back side of the wafer. Hydrogen passivation by MIRHP was done and metallic front contact was applied in the grooves on the frontside of the wafer by the use of Ni/Cu plating. The lifetime of the wafer was measured after each of the above process steps. Compared to the untreated wafer the lifetime increased after the first diffusion step and the silicon nitride deposition step. However, after the diffusion step at 950° C. the lifetime was reduced to such a low level that it could not be measured. This is as expected for conventional multicrystalline wafers. The process steps following the diffusion process at 950° C. resulted in a small increase of the lifetime, but lifetimes typical for conventional multicrystalline solar cells processed according to the conventional screen-print method which only comprises heat treatment steps a low or moderate temperatures was not obtained.

EXAMPLE 2

High temperature processing (buried contacts) of silicon wafer having a relatively high phosphorous content.

Phosphorous was by $POCl_3$ diffusion forced into a p-type wafer containing 1 ppma B, 0.8 ppma P and $1-5.10^{14}$ Fe atoms per $cm^3$ until the sheet resistance was 100 ohm $cm^2$. An anti-reflection coating was applied to the front side of the wafer by silicon nitride CVD deposition. Grooves for contacts was made in the wafer surface and phosphorous was diffused into the grooves by $POCl_3$ diffusion at a temperature of 950° C. for some minutes. After the diffusion process the sheet resistance was 10 ohm $cm^3$. Back contacts of Al was alloyed into the back side of the wafer. Hydrogen passivation by MIRHP was conducted and metallic front contacts was applied in the grooves on the front side of the wafer by Ni/Cu plating. The lifetime of the wafer was measured after each of the above process steps. Compared to the untreated wafer the lifetime increased after the first diffusion step and after applying the silicon nitride layer. After diffusion at 950° C. the lifetime was increased to a level far better than the lifetime of the untreated wafer. This is contrary to what was observed for the conventional multicrystalline wafer in Example 2. The process steps following the high temperature diffusion resulted in a small increase in the lifetime and it was at the and obtained a lifetime in microseconds that is more than 3 times better than the lifetime for conventional multicrystalline solar cells processed after the standard screen-print process which only comprises heat treatment at lower or moderate temperatures.

The results show that multicrystalline wafers made from compensated silicon according to the invention which have been subjected to phosphorous diffusion and phosphorous gettering at high temperatures show a surprisingly high lifetime compared to the lifetime of conventional multicrystalline wafers treated at lower temperatures, while the results from Example 1 shows that when conventional multicrystalline wafers are subjected to high temperature treatment a reduction of lifetime is experienced.

The invention claimed:

1. A method for phosphorous diffusion and phosphorous gettering of compensated p-type multicrystalline wafers at high temperatures comprising:
    subjecting p-type multicrystalline silicon wafers containing 0.2-2.8 ppma boron and 0.06-2.8 ppma phosphrous to phosphorous diffusion and phosphorous gettering at a temperature of at least 950° C.

2. The method of claim 1, wherein the multicrystalline wafers contain 0.3-0.75 ppma boron and 0.1 to 0.75 ppma phosphorous.

3. The method of claim 1, wherein a ratio between ppma phosphorous and ppma boron is between 0.2 and 1.

4. The method of claim 1, wherein the multicrystalline wafers further contain 0.06-2.8 ppma arsenic.

5. A method for phosphorous diffusion and phosphorous gettering of compensated p-type multicrystalline wafers at high temperatures to increase lifetime of the wafers comprising:
    obtaining p-type multicrystalline silicon wafers containing 0.2-2.8 ppma boron and 0.06-2.8 ppma phosphorous, and
    subjecting the p-type multicrystalline silicon wafers to phosphorous diffusion and phosphorous gettering at a temperature of at least 950° C., thereby increasing the lifetime of minority carriers.

6. The method of claim 5, wherein the multicrystalline wafers contain 0.3-0.75 ppma boron and 0.1 to 0.75 ppma phosphorous.

7. The method of claim 5, wherein a ratio between ppma phosphorous and ppma boron is between 0.2 and 1.

8. The method of claim 5, wherein the multicrystalline wafers further contain 0.06-2.8 ppma arsenic.

* * * * *